(12) United States Patent
Takahashi et al.

(10) Patent No.: US 9,668,374 B2
(45) Date of Patent: May 30, 2017

(54) HEAT DISSIPATING COMPONENT AND ELECTRONIC DEVICE

(71) Applicants: Masafumi Takahashi, Kanagawa (JP); Tetsuya Ogata, Tokyo (JP)

(72) Inventors: Masafumi Takahashi, Kanagawa (JP); Tetsuya Ogata, Tokyo (JP)

(73) Assignee: RICOH COMPANY, LTD., Tokyo (JP)

(*) Notice: Subject to any disclaimer, the term of this patent is extended or adjusted under 35 U.S.C. 154(b) by 249 days.

(21) Appl. No.: 14/306,496

(22) Filed: Jun. 17, 2014

(65) Prior Publication Data

US 2015/0003018 A1 Jan. 1, 2015

(30) Foreign Application Priority Data

Jun. 27, 2013 (JP) ................................ 2013-134569

(51) Int. Cl.
*H05K 7/20* (2006.01)

(52) U.S. Cl.
CPC ........... *H05K 7/20* (2013.01); *H05K 7/20454* (2013.01); *H05K 7/20509* (2013.01)

(58) Field of Classification Search
None
See application file for complete search history.

(56) References Cited

U.S. PATENT DOCUMENTS

| | | | | |
|---|---|---|---|---|
| 7,619,893 B1* | 11/2009 | Yu | ....................... | H01L 23/3672 165/185 |
| 7,855,888 B2* | 12/2010 | Peterson | ............. | F28D 15/0275 165/104.33 |
| 8,059,406 B1* | 11/2011 | Meyer, IV | .......... | F28D 15/0233 165/104.21 |
| 8,599,557 B2* | 12/2013 | Peterson | ................... | G06F 1/20 165/104.21 |
| 2008/0264613 A1* | 10/2008 | Chu | .................... | H01L 23/4093 165/104.33 |
| 2010/0085712 A1* | 4/2010 | Hrehor, Jr. | ......... | H05K 7/20254 361/699 |
| 2011/0298925 A1 | 12/2011 | Inoue et al. | | |

(Continued)

FOREIGN PATENT DOCUMENTS

| | | |
|---|---|---|
| JP | S52-37263 | 3/1977 |
| JP | S57-39441 | 3/1982 |
| JP | H1-305548 | 12/1989 |

(Continued)

OTHER PUBLICATIONS

Japanese official action dated Feb. 22, 2017 in connection with corresponding.
Japanese Patent Application No. 2013-134569.

*Primary Examiner* — Courtney Smith
*Assistant Examiner* — Zhengfu Feng
(74) *Attorney, Agent, or Firm* — Cooper & Dunham LLP

(57) ABSTRACT

A heat dissipating component includes a plurality of heat absorbers each provided for a corresponding one of a plurality of electronic components and to absorb heat from the corresponding one of the plurality of electronic components, and a heat dissipator thermally connected to the plurality of heat absorbers and to dissipate the heat absorbed by the plurality of heat absorbers. The heat dissipating component may be incorporated in an electronic device.

5 Claims, 14 Drawing Sheets

(56) References Cited

U.S. PATENT DOCUMENTS

2013/0222664 A1  8/2013  Takahashi et al.

FOREIGN PATENT DOCUMENTS

| JP | 2004-020798 | 1/2004 |
| JP | 2004-104632 | 4/2004 |
| JP | 2010-141133 | 6/2010 |
| JP | 2011-259101 | 12/2011 |
| WO | WO2011/158615 A1 | 12/2011 |

* cited by examiner ate heat generation of a plurality of electronic components. For the sake of convenience, the heat dissipating component is often referred to simply as the "component" in the following description.

HEAT DISSIPATING COMPONENT AND ELECTRONIC DEVICE

CROSS-REFERENCE TO RELATED APPLICATIONS

This patent application is based on and claims priority pursuant to 35 U.S.C. §119(a) to Japanese Patent Application No. 2013-134569, filed on Jun. 27, 2013 in the Japan Patent Office, the entire disclosure of which is hereby incorporated by reference herein.

BACKGROUND

Technical Field

The present invention relates to a heat dissipating component and an electronic device having the heat dissipating component.

Description of the Related Art

In an electronic device such as an image pickup apparatus or the like, heat generation of electronic components mounted thereon tends to increase along with advancement of performances of the electronic device. Ina case of an image pickup apparatus, examples of factors in the increase in heat generation of electronic components include an increased number of pixels of the image pickup device and an improved functionality of an integrated circuit performing image processing.

Influences of the heat generation of the electronic components in the case of an image pickup apparatus include problems such as an increase in the temperature of the image pickup device that may possibly result in deterioration of image qualities due to thermal noises or in technical troubles due to the temperature exceeding the junction temperature, for example.

In particular, an electronic device of recent years includes, in order to reduce its size, a plurality of electronic components densely arranged on a substrate within a casing, and accordingly a problem of heat dissipation of electronic components becomes more serious.

Therefore, there is proposed an approach of dissipating heat by bringing a plurality of electronic components mounted on an electronic device into contact with a single heat dissipating component. However, when a plurality of electronic components are in contact with a single heat dissipating component, heat from one of the plurality of electronic components may often be transferred to a different one of the electronic components through the heat dissipating component. In this case, troubles and errors may possibly occur in this different electronic component to which the heat has been transferred.

SUMMARY

Example embodiments of the present invention include a heat dissipating component including: a plurality of heat absorbers each provided for a corresponding one of a plurality of electronic components and configured to absorb heat from the corresponding one of the plurality of electronic components; and a heat dissipator thermally connected to the plurality of heat absorbers and configured to dissipate the heat absorbed by the plurality of heat absorbers. The heat dissipating component may be incorporated in an electronic device.

BRIEF DESCRIPTION OF THE SEVERAL VIEWS OF THE DRAWINGS

A more complete appreciation of the disclosure and many of the attendant advantages and features thereof can be readily obtained and understood from the following detailed description with reference to the accompanying drawings, wherein.

Figure 1:
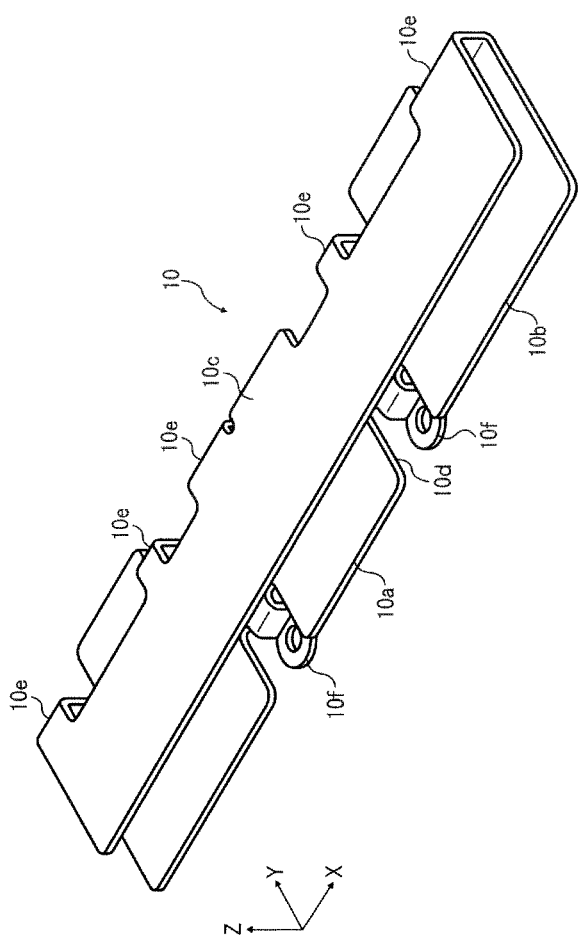
FIG. 1 is a perspective view illustrating a heat dissipating component according to an embodiment of the present invention.

The accompanying drawings are intended to depict example embodiments of the present invention and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

In describing example embodiments shown in the drawings, specific terminology is employed for the sake of clarity. However, the present disclosure is not intended to be limited to the specific terminology so selected and it is to be understood that each specific element includes all technical equivalents that operate in a similar manner.

FIG. 1 is a perspective view illustrating a heat dissipating component according to an embodiment of the present invention. The heat dissipating component of this embodiment is a component, which is used to absorb and dissipate heat generated from a plurality of electronic components mounted on an electronic device. As illustrated in FIG. 1, the heat dissipating component 10 includes heat absorbers 10a and 10b, a heat dissipator 10c, a blocking member 10d, flexed members 10e, and attachment members 10f.

The heat dissipating component 10 is manufactured using a material having a high thermal conductivity coefficient, such as aluminum or copper.

When the heat dissipating component 10 is made of aluminum, its surface may be subjected to a black anodic oxidation treatment. By having the surface of the heat dissipating component 10 be subjected to the black anodic oxidation treatment, a radiation factor of the heat dissipating component 10 rises and heat radiating from the surface of the heat dissipating component 10 increases.

The heat dissipating component 10 includes the heat absorbers 10a and 10b for absorbing heat from an electronic component and the heat dissipator 10c for dissipating heat that has been absorbed by the heat absorbers 10a and 10b, the heat absorbers 10a and 10b and the heat dissipator 10c being integrally provided by bending or casting the material having a high thermal conductivity coefficient.

There are provided a plurality of the heat absorbers 10a and 10b in correspondence with the number of electronic components. Referring to FIG. 1, the heat dissipating component 10 includes the two heat absorbers 10a and 10b in order to dissipate heat from two electronic components.

Each of the heat absorbers 10a and 10b includes a surface that is in parallel with the electronic components mounted on a substrate of the electronic device so as to be thermally connected to a corresponding one of the electronic components mounted on the substrate.

The heat dissipator 10c is disposed on a side opposite of contact surfaces with the electronic components of the heat absorbers 10a and 10b via the flexed members 10e, and thermally connected to the heat absorbers 10a and 10b.

Figure 2:
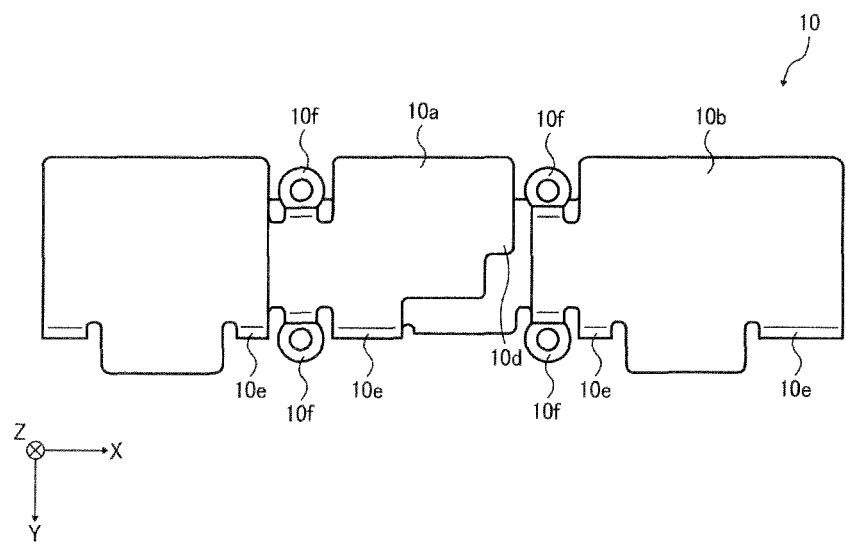
FIG. 2 is a front view of the heat dissipating component illustrated in FIG. 1.

FIG. 2 is a front view of the heat dissipating component 10. As illustrated in FIG. 2, the heat dissipating component 10 includes the blocking member 10d that thermally blocks between the heat absorbers 10a and 10b.

The blocking member 10d is provided between the heat absorber 10a and the heat absorber 10b. The blocking member 10d is provided, for example, as a gap between the heat absorber 10a and the heat absorber 10b for preventing heat from being directly transferred between the heat absorbers 10a and 10b.

In the heat dissipating component 10, heat absorbed by the heat absorbers 10a and 10b is always transferred to the heat dissipater 10c. In other words, providing the blocking member 10d for the heat dissipating component 10 increases a distance for heat transfer between the heat absorbers 10a and 10b.

Therefore, according to the heat dissipating component 10, it is possible to prevent heat from an electronic component absorbed by one of the heat absorbers 10a and 10b from being transferred to a different electronic component through the other of the heat absorbers 10a and 10b.

The flexed members 10e are provided between the heat absorbers 10a and 10b and the heat dissipator 10c (along one side in a longitudinal direction in this embodiment). With the flexed members 10e, the heat dissipating component 10 may be configured such that the heat dissipator 10c is provided so as to be lapped over surfaces opposite of the contact surfaces with the electronic components of the heat absorbers 10a and 10b. In other words, according to the heat dissipating component 10, it is possible to secure a sufficient area for the heat dissipator 10c without increasing an area along an X axis direction or a Y axis direction (direction along the substrate).

A total surface area of the heat absorbers 10a and 10b and the heat dissipator 10c in the heat dissipating component 10 is greater than a surface area of the substrate on which the electronic components are mounted. In the heat dissipating component 10, an area corresponding to the substrate on which the electronic components are mounted may be obtained as an area of the heat dissipater 10c. Further, in the heat dissipating component 10, as heat is also dissipated as radiation heat from the surfaces of the heat absorbers 10a and 10b, these surfaces are included in an area for heat dissipation.

In other words, in the heat dissipating component 10, as the area for heat dissipation that is greater than the substrate on which the electronic components are mounted may be obtained, it is possible to effectively dissipate heat of the electronic components attached to the substrate.

The attachment members 10f are provided in order to attach the heat dissipating component 10 to the substrate of the electronic device. The attachment members 10f are provided so as to be able to separately support the heat absorbers 10a and 10b.

Further, each of the attachment members 10f includes a hole through which a fixation member such as a screw is inserted when the heat dissipating component 10 is attached to the substrate of the electronic device.

Figure 3:
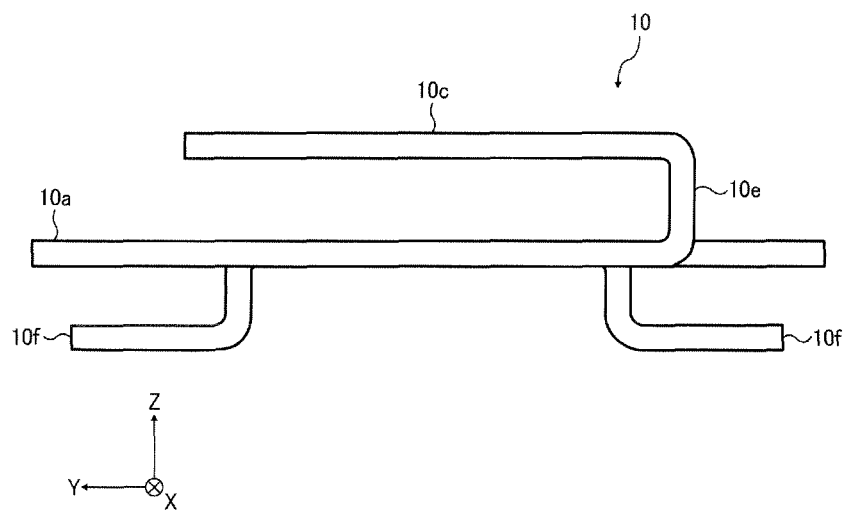
FIG. 3 is a plan view of the heat dissipating component illustrated in FIG. 1.

FIG. 3 is a plan view illustrating the heat dissipating component 10. As illustrated in FIG. 3, in the heat dissipating component 10, the attachment members 10f, the heat absorbers 10a and 10b (only the heat absorber 10a is shown in FIG. 3), and the heat dissipator 10c are located at positions different from one another in a Z axis direction (height direction).

With such a configuration, it is possible for the heat dissipating component 10 to secure a gap between the heat absorbers 10a and 10b and the heat dissipator 10c in the height direction. Therefore, according to the heat dissipating component 10, it is possible to secure a sufficient area for the heat dissipator 10c without exceeding the area of the substrate of the electronic device along the X axis direction or the Y axis direction (direction along the substrate).

By providing the heat absorbers 10a and 10b and the attachment members 10f at positions different from each other in the height direction, it is possible for the heat dissipating component 10 to secure a gap with the electronic components on the substrate. In other words, according to the heat dissipating component 10, it is possible to prevent a conducting portion on the substrate and the heat dissipating component 10 from being brought into contact with each other to cause a short-circuit.

Next, the electronic device according to an embodiment of the present invention will be described taking an image pickup apparatus as an example.

Figure 4:
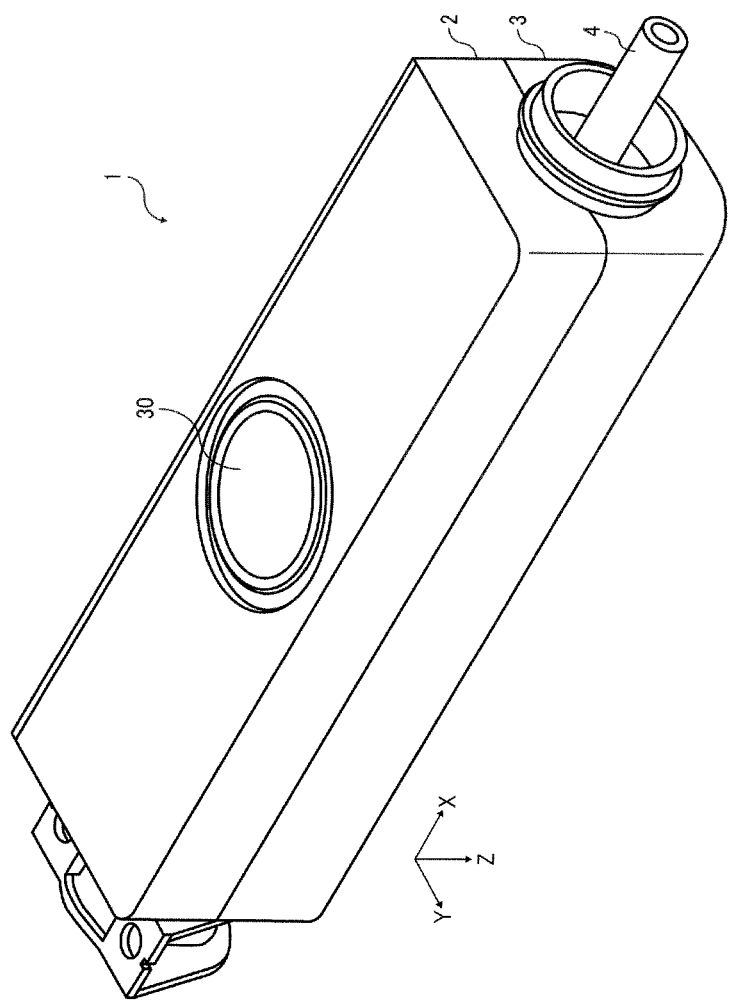
FIG. 4 is a perspective view illustrating an electronic device (image pickup apparatus) according to the embodiment of the present invention.
Figure 5:
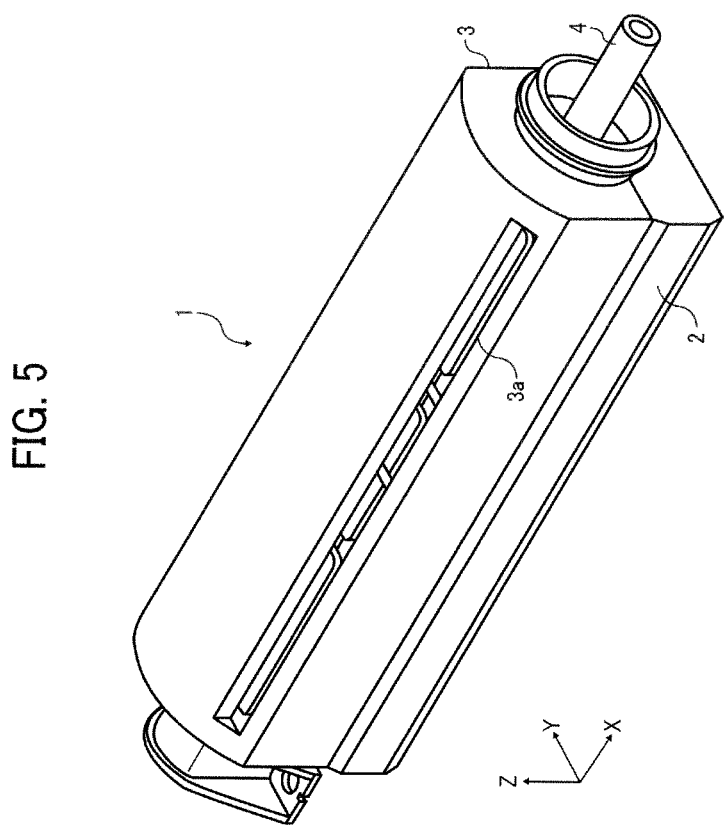
FIG. 5 is a rear perspective view of the image pickup apparatus illustrated in FIG. 4.

FIG. 4 is a perspective view illustrating an electronic device according to an embodiment of the present invention, which is implemented as an image pickup apparatus. FIG. 5 is a rear perspective view of the image pickup apparatus. As illustrated in FIGS. 4 and 5, an image pickup apparatus 1 includes a front cover 2, a back cover 3, a rotary shaft 4, and a camera module 30.

The front cover 2 and the back cover 3 are integrally assembled to constitute a casing of the image pickup apparatus 1.

The camera module 30, excluding a lens unit 9 that is exposed outside, is encircled within the casing constituted by the front cover 2 and the back cover 3.

By making the image pickup apparatus 1 to rotate around the rotary shaft 4, it is possible to change the direction in which the image pickup apparatus 1 takes images. Here, assuming that a direction of an optical axis of the lens of the lens unit 9 (FIG. 7) is a Z axis and that a longitudinal direction and a lateral direction of the image pickup apparatus 1 are an X axis and a Y axis, respectively, the rotary shaft 4 is attached in the direction of the X axis or the Y axis. In this embodiment, the axial direction of the rotary shaft 4 is the X axis direction, and the image pickup apparatus 1 is attached so as to rotate around the X axis.

Figure 6:
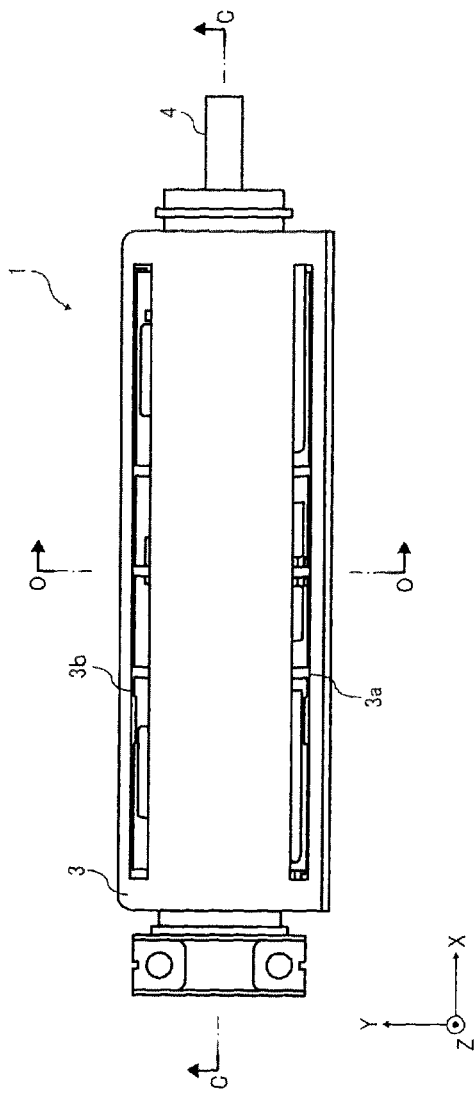
FIG. 6 is a rear view of the image pickup apparatus illustrated in FIG. 4.

FIG. 6 is a rear view of the image pickup apparatus 1. As illustrated in FIG. 6, the back cover 3 is provided with ventilation slits 3a and 3b. The ventilation slits 3a and 3b are provided on the both sides with the rotary shaft 4 interposed therebetween. Providing the ventilation slits 3a and 3b realizes ventilation between an interior and an exterior of the image pickup apparatus 1.

Figure 7:
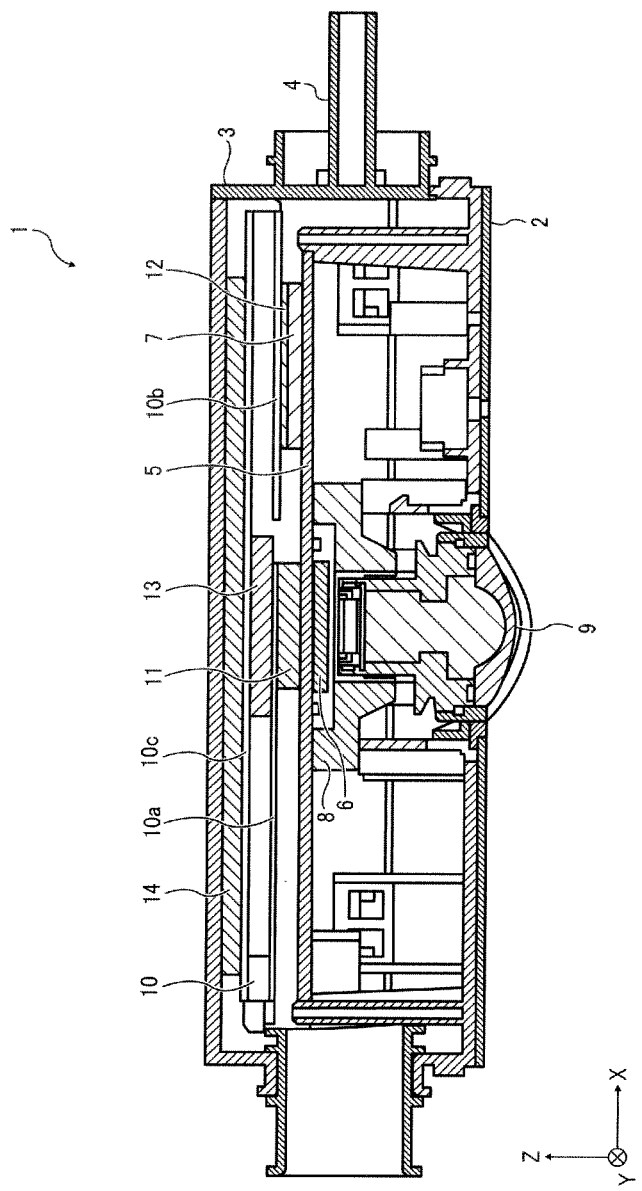
FIG. 7 is a sectional side view of the image pickup apparatus illustrated in FIG. 4.
Figure 8:
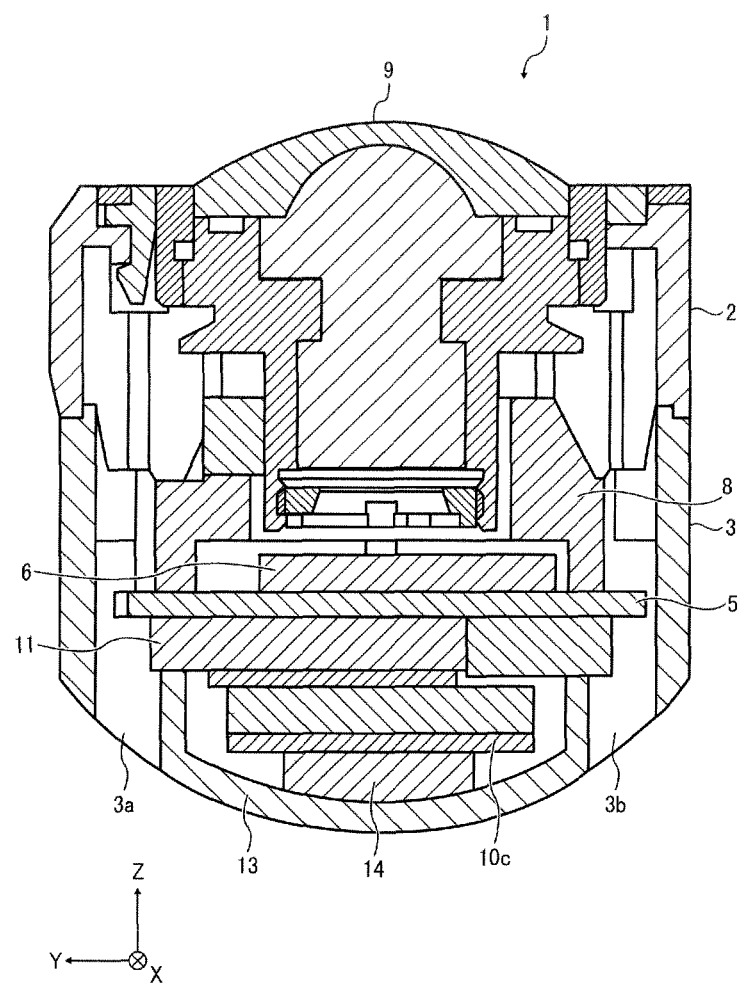
FIG. 8 is a cross-sectional view of the image pickup apparatus illustrated in FIG. 4.

FIG. 7 is a sectional side view of the image pickup apparatus 1. FIG. 8 is a cross-sectional view of the image pickup apparatus 1. As illustrated in FIGS. 7 and 8, the image pickup apparatus 1 includes a printed circuit board (PCB) 5 and an image pickup device 6 within the casing. Moreover, the image pickup apparatus 1 includes a field-programmable gate array (FPGA) 7, a lens holder 8, and the lens unit 9. In addition, the image pickup apparatus 1 includes the heat dissipating component 10 and thermally-conductive members 11, 12, 13, and 14 within the casing.

Furthermore, as illustrated in FIG. 8, the heat dissipator 10c is located at a position at which the heat dissipator 10c is brought into contact with air introduced through the ventilation slits 3a and 3b within the casing of the image pickup apparatus 1.

Figure 9:
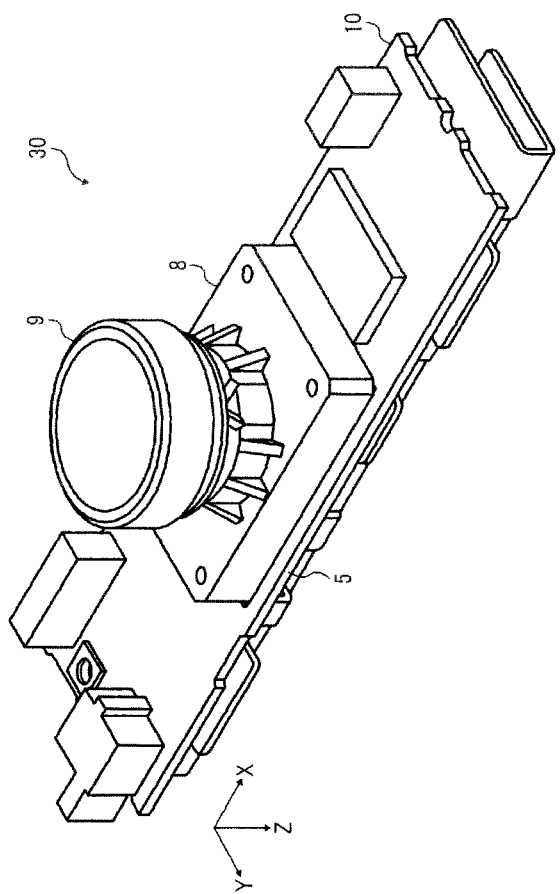
FIG. 9 is a perspective view illustrating a camera module of the image pickup apparatus illustrated in FIG. 4.
Figure 10:
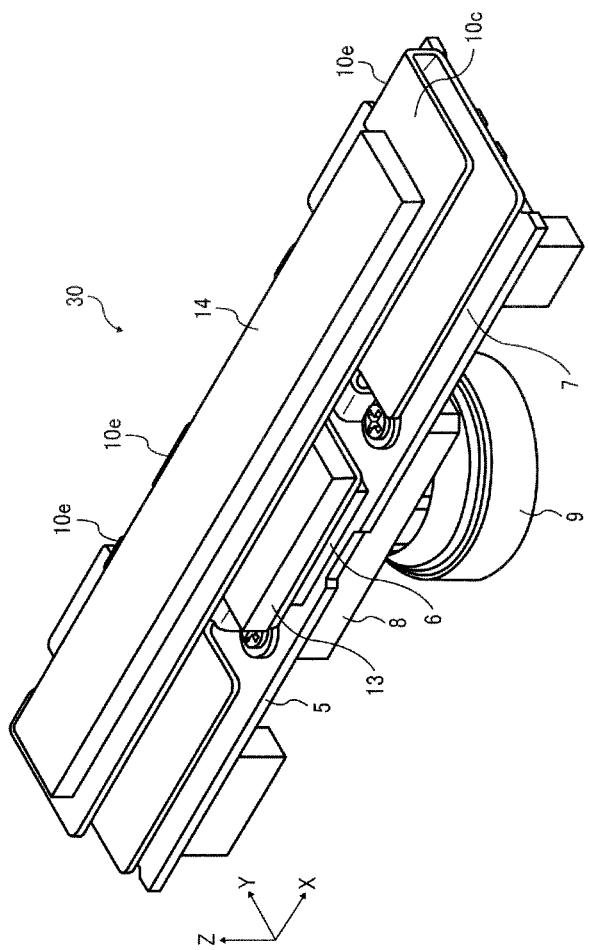
FIG. 10 is a rear perspective view of the camera module of the image pickup apparatus illustrated in FIG. 4.

FIG. 9 is a perspective view of the camera module 30. FIG. 10 is a rear perspective view of the camera module 30 of the image pickup apparatus 1.

As illustrated in FIGS. 9 and 10, the PCB 5, the image pickup device 6, the FPGA 7, the lens holder 8, the lens unit 9, and the heat dissipating component 10 constitute the camera module 30.

On a front surface of the PCB 5, the lens holder 8 holding the lens unit 9 is fixed. Further, on a rear surface of the PCB 5, the image pickup device 6 and the heat dissipating component 10 are fixed.

The image pickup device 6 is an image sensor configured by a photoelectric conversion element such as a complementary metal-oxide semiconductor (CMOS) image sensor or a charge-coupled device (CCD) image sensor. The image pickup device 6 generates heat in use, and when subjected to high temperatures, produces thermal noises and causes deterioration in image qualities.

The FPGA 7 is an electronic component used in processing or the like of picked-up images obtained by the image pickup device 6. Similarly to the image pickup device 6, the FPGA 7 also generates heat in use. The FPGA 7 may often go out of order when its temperature exceeds a supposed junction temperature (temperature at a chip-bonding surface of a semiconductor component).

Here, calorific values of the image pickup device 6 and the FPGA 7 tend to increase due to an increase in the number of pixels of the picked-up images or an improvement in functionality of the image processing.

Further, in an image pickup apparatus of recent years, as components are often densely arranged within the casing in order to reduce its size, electronic components such as the image pickup device 6 and the FPGA 7 are closely arranged on a single PCB 5, and this makes dissipation of heat from the electronic component more difficult.

In the meantime, calorific values and heat resistance guaranteed temperatures of the plurality of electronic components mounted on the electronic device are often different from each other (for example, equal to or lower than 70° C. in the case of a CMOS used for the image pickup device 6, and equal to or lower than 85° C. for the FPGA 7). Accordingly, the heat dissipating component 10 for cooling the plurality of electronic components is required to effectively dissipate heat while suppressing heat transfer between the electronic components as much as possible.

In other words, the heat dissipating component 10 is required to be configured such that an electronic component on a low temperature side may not be excessively heated due to heat transferred from an electronic component on a high temperature side to the electronic component on the low temperature side.

The lens unit 9 generates image data by causing the image pickup device 6 to form a subject image. The generated image data is subjected to image processing by the FPGA 7.

Heat generated by the image pickup device 6 and the FPGA 7 is transferred to the heat dissipating component 10 that is fixed to the PCB 5, and dissipated through the heat dissipating component 10.

Figure 11:
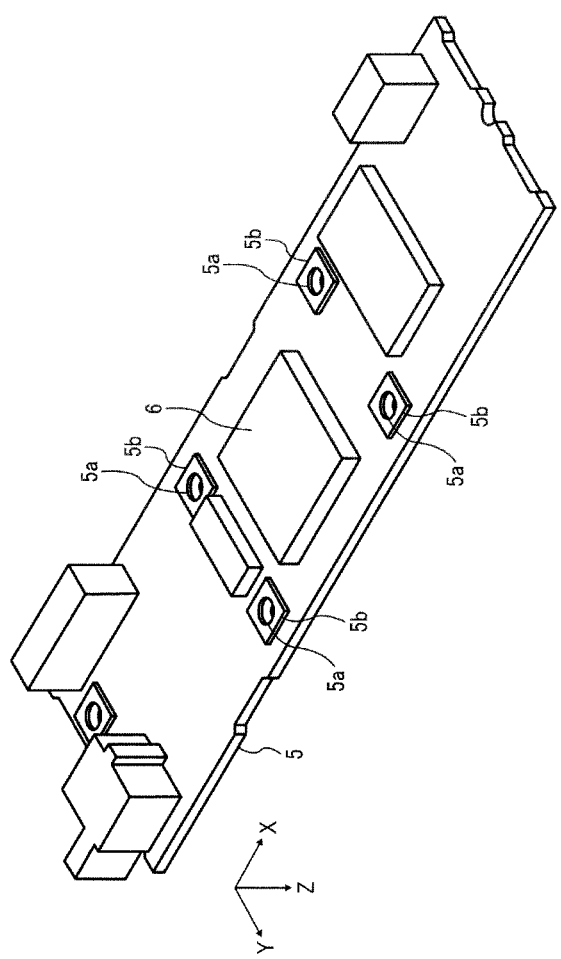
FIG. 11 is a perspective view illustrating a substrate of the image pickup apparatus illustrated in FIG. 4.
Figure 12:
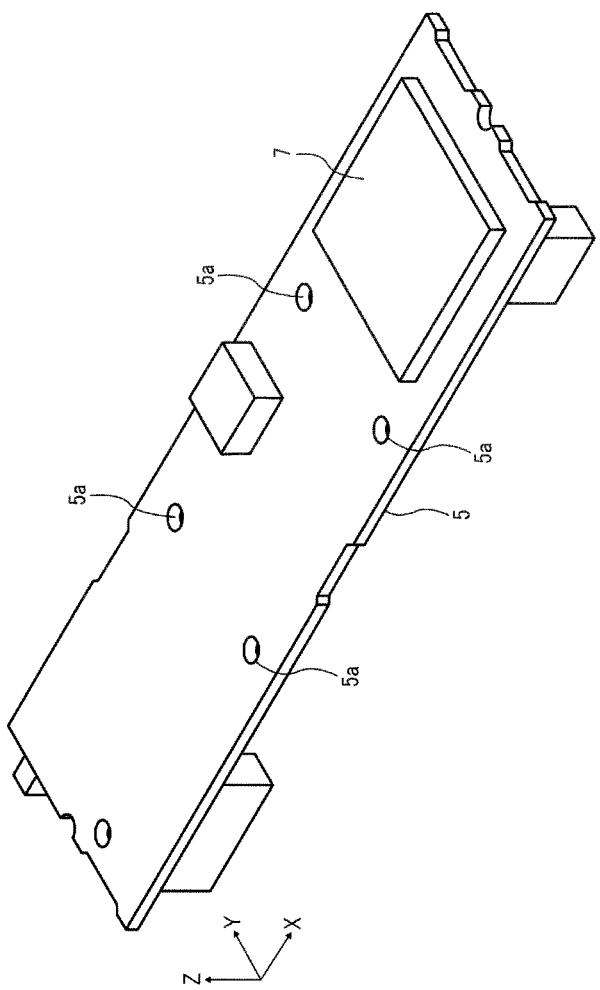
FIG. 12 is a rear perspective view of the substrate of the image pickup apparatus illustrated in FIG. 4.

FIG. 11 is a perspective view of h PCB 5. FIG. 12 is a rear perspective view of the PCB 5.

The PCB 5 is an example of a circuit board. The image pickup device 6 is mounted on a front side (object side) of the PCB 5, and the FPGA 7 is mounted on a rear side (image side) of the PCB 5.

The PCB 5 includes attachment holes 5a at attachment positions at which the attachment members 10f are attached. Further, an electrically-conductive member 5b is exposed around each of the attachment holes 5a. With such a configuration, when the heat dissipating component 10 is attached to the PCB 5, heat may be transferred from the PCB 5 to the heat dissipating component 10 through the electrically-conductive member 5b.

The thermally-conductive members 11, 12, 13, and 14 are members containing a material having high thermal conductivity such as ceramic filler. Desirably, the thermally-conductive members 11, 12, 13, and 14 are resilient members such as silicone sheets.

The thermally-conductive member 11 is disposed between the heat absorber 10a and a back surface of the PCB 5 on which the image pickup device 6 is mounted.

The thermally-conductive member 11 conducts heat from the image pickup device 6 to the heat absorber 10a by increasing thermal contact between the image pickup device 6 and the heat absorber 10a. Further, the thermally-conductive member 11 absorbs variation in height between the heat dissipating component 10 and the PCB 5, thereby preventing the PCB 5 from being applied too much load such as a stress.

The thermally-conductive member 12 is disposed between the heat absorber 10b and a back surface of the FPGA 7.

The thermally-conductive member 12 conducts heat from the FPGA 7 to the heat absorber 10b by increasing thermal contact between the FPGA 7 and the heat absorber 10b. Further, the thermally-conductive member 12 absorbs variation in height between the heat dissipating component 10 and the FPGA 7, thereby preventing the PCB 5 from being applied too much load such as a stress.

The thermally-conductive member 13 is disposed between the heat absorber 10a and the heat dissipator 10c.

The thermally-conductive member 13 makes the heat absorbed by the heat absorber 10a to be more easily conducted to the heat dissipator 10c by increasing thermal contact between the heat absorber 10a and the heat dissipator 10c.

The thermally-conductive member 14 is disposed on a front surface of the heat dissipator 10e (one of two surfaces of the heat dissipator 10c that is not facing toward heat absorbers 10a and 10b). When attaching the back cover 3, the thermally-conductive member 14 is disposed between the back cover 3 and the heat dissipator 10c to increase thermal contact between the heat dissipator 10c and the back cover 3, thereby transferring the heat received by the heat dissipator 10c to the back cover 3.

Further, the thermally-conductive member 14 absorbs variation in height between the heat dissipating component 10 and the back cover 3, thereby preventing the heat dissipating component 10 and the PCB 5 from being applied too much load such as a stress.

The heat from the image pickup device 6 is conducted to the heat absorber 10a through the thermally-conductive member 11. The heat received by the heat absorber 10a is transferred to the heat dissipator 10c through the flexed members 10e and the thermally-conductive member 13, and dissipated through the back cover 3, as well as through a front surface of the heat dissipating component 10 based on convective heat transfer.

The heat from the FPGA 7 is conducted to the heat absorber 10b through the thermally-conductive member 12, transferred from the heat absorber 10b to the heat dissipator 10c through the flexed members 10e, and dissipated through the back cover 3. Further, the heat received by the heat dissipator 10c is also dissipated through the front surface of the heat dissipating component 10 based on the convective heat transfer.

The heat absorbers 10a and 10b are provided separately: the heat absorber 10a to which the heat from the image pickup device 6 is conducted and the heat absorber 10b to which the heat from the FPGA 7 is conducted. Accordingly, the heat dissipating component 10 is able to dissipate heat individually for each electronic component as described above, while suppressing the heat transfer between the image pickup device 6 and the FPGA 7 as much as possible.

Next, a heat dissipating component according to another embodiment of the present invention will be described focusing on differences from the embodiment described above.

Figure 13:
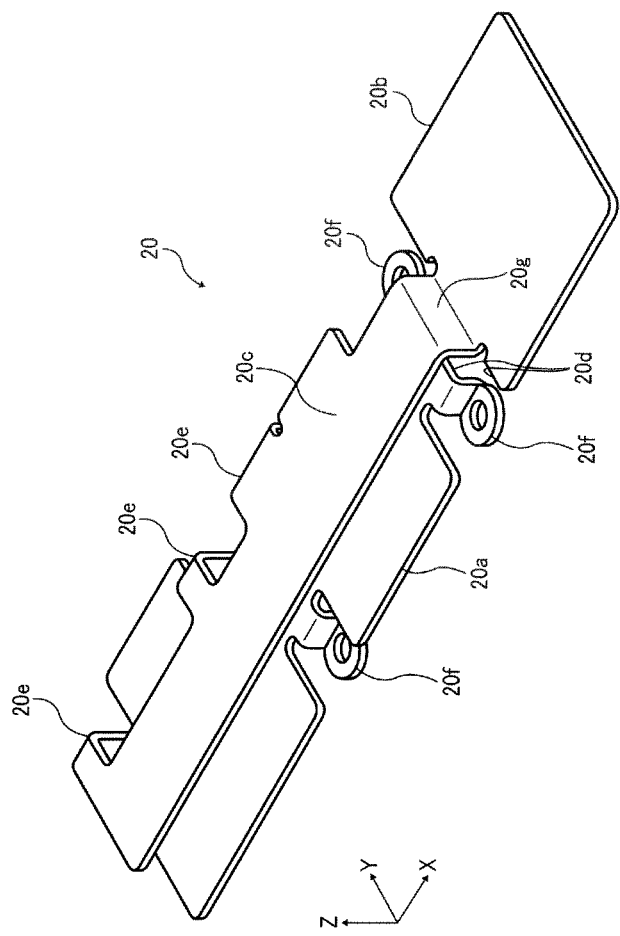
FIG. 13 is a perspective view illustrating a heat dissipating component according to a different embodiment of the present invention.
Figure 14:
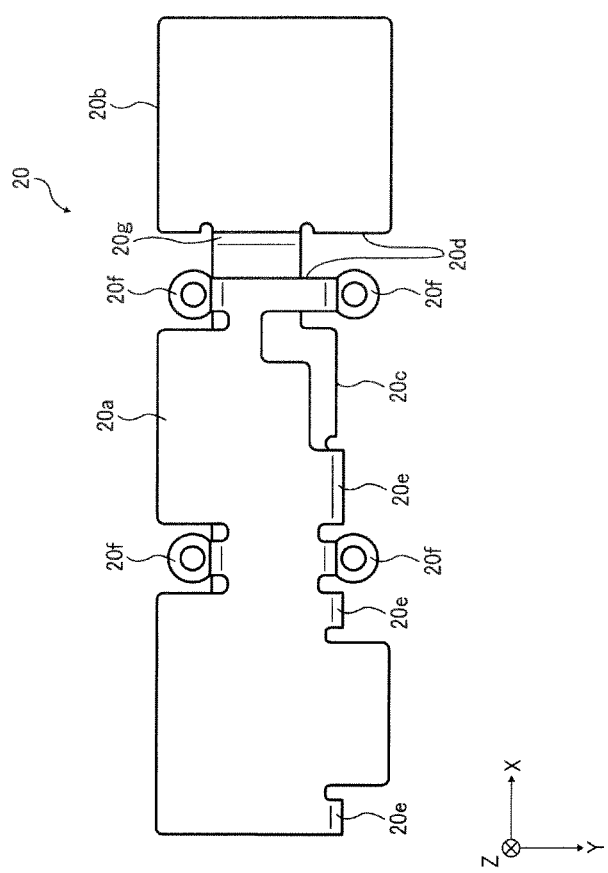
FIG. 14 is a front view of the heat dissipating component illustrated in FIG. 13.

FIG. 13 is a perspective view illustrating the heat dissipating component according to another embodiment of the present invention. FIG. 14 is a front view of the heat dissipating component illustrated in FIG. 13.

As illustrated in FIGS. 13 and 14, in a heat dissipating component 20 according to this embodiment, a position at which a flexed member 20g for thermally connecting a heat absorber 20b and a heat dissipator 20c is provided is different from that for the heat absorber 10b of the heat dissipating component 10 described above.

Specifically, while a flexed member 20e for thermally connecting the heat absorber 20a and the heat dissipator 20c is provided along one side surface of the heat dissipating component 20 in a longitudinal direction, the flexed member 20g is provided along one side surface of the heat dissipating component 20 in a lateral direction.

Figure 15:
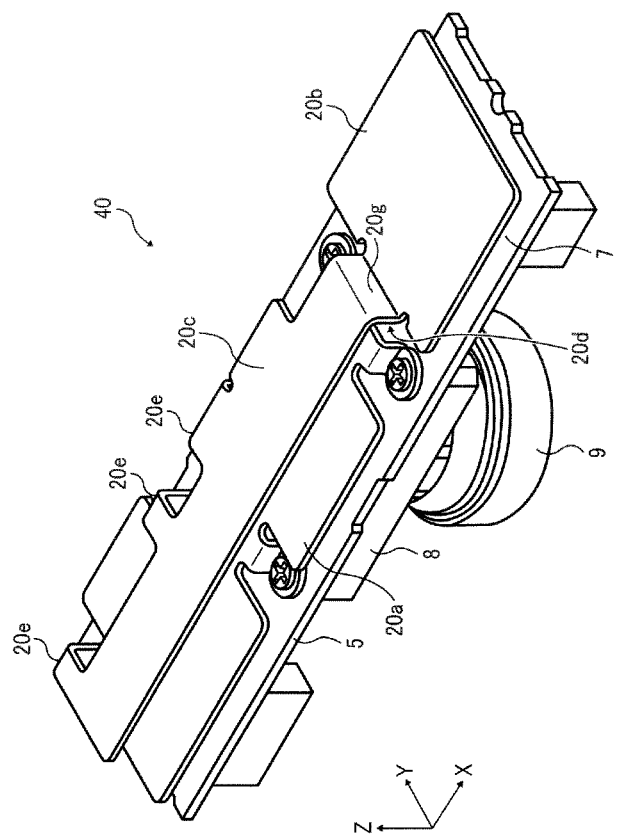
FIG. 15 is a perspective view illustrating a camera module to which the heat dissipating component illustrated in FIG. 13.

FIG. 15 is a perspective view illustrating a camera module 40 to which the heat dissipating component 20 is attached.

As illustrated in FIG. 15, in the camera module 40, heat from an image pickup device 6 is conducted to the heat absorber 20a similarly to the camera module 30 described previously. The heat received by the heat absorber 20a is transferred to the heat dissipator 20c through the flexed member 20e and dissipated through a back cover, as well as through a front surface of the heat dissipating component 20 based on convective heat transfer.

The heat from a FPGA 7 is conducted to the heat absorber 20b, transferred from the heat absorber 20b to the heat dissipator 20c through the flexed member 20g, and dissipated through the back cover. Further, the heat received by the heat dissipator 20c is also dissipated through the front surface of the heat dissipating component 20 based on the convective heat transfer.

The heat absorbers 20a and 20b are provided separately: the heat absorber 20a to which the heat from the image pickup device 6 is conducted and the heat absorber 20b to which the heat from the FPGA 7 is conducted. Accordingly, the heat dissipating component 20 is able to dissipate heat individually for each electronic component as described above, while suppressing the heat transfer between the image pickup device 6 and the FPGA 7 as much as possible.

According to the embodiments of the present invention, heat may be dissipated through a single member while heat transfer between a plurality of electronic components is suppressed. As one example, according to the heat dissipating components 10 and 20 described above, a structure in which heat from a plurality of electronic components (heat sources) is separately dissipated through a single component may be realized at a low cost and with a reduced space.

Numerous additional modifications and variations are possible in light of the above teachings. It is therefore to be understood that within the scope of the appended claims, the disclosure of the present invention may be practiced otherwise than as specifically described herein. With some embodiments of the present invention having thus been described, it will be obvious that the same may be varied in many ways. For example, elements and/or features of different illustrative embodiments may be combined with each other and/or substituted for each other.

What is claimed is:

1. An electronic device having a plurality of electronic components mounted thereon, the electronic device comprising:
   a heat dissipating component comprising:
      a plurality of heat absorbers separated from each other by gaps and each provided for a corresponding one of a plurality of electronic components to absorb heat from the corresponding one of the plurality of electronic components;
      a heat dissipater thermally connected to the plurality of heat absorbers, to dissipate the heat absorbed by the plurality of heat absorbers; and
      flexed members disposed to join (a) the plurality of heat absorbers and (b) the heat dissipater to each other,
   wherein the heat dissipating component further comprises:
   a plurality of attachment members disposed to attach the heat dissipating component to a substrate of the plurality of electronic components; and
   electrically-conductive members including exposed portions disposed around each of the plurality of attachment members and on which the plurality of electronic components are mounted.

2. The electronic device according to claim 1, wherein the heat dissipating component further comprises:

a thermally-conductive member provided on at least one of the plurality of electronic components so as to increase thermal contact between the heat absorber and the dissipater.

3. The electronic device according to claim 1, wherein the heat dissipating component further comprises:
a plurality of attachment members disposed to attach the heat dissipating component to a substrate of the plurality of electronic components while securing a gap between the substrate and the plurality of heat absorbers.

4. The electronic device according to claim 1, wherein the heat dissipating component further comprises:
a thermally-conductive member provided on at least one of the plurality of electronic components so as to increase thermal contact between the electronic component and the heat absorber.

5. The electronic device according to claim 1, further comprising:
a casing encircling the substrate to which the electronic components and the heat dissipating component are attached; and
a thermally-conductive member that brings the heat dissipating component into contact with an inner surface of the casing.

* * * * *